(12) United States Patent
Meyer et al.

(10) Patent No.: US 9,997,444 B2
(45) Date of Patent: Jun. 12, 2018

(54) MICROELECTRONIC PACKAGE HAVING A PASSIVE MICROELECTRONIC DEVICE DISPOSED WITHIN A PACKAGE BODY

(71) Applicant: INTEL CORPORATION, Santa Clara, CA (US)

(72) Inventors: Thorsten Meyer, Regensburg (DE); Gerald Ofner, Regensburg (DE); Andreas Wolter, Regensburg (DE); Georg Seidemann, Landshut (DE); Sven Albers, Regensburg (DE); Christian Geissler, Teugn (DE)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 15/117,716

(22) PCT Filed: Mar. 12, 2014

(86) PCT No.: PCT/US2014/024112
§ 371 (c)(1),
(2) Date: Aug. 9, 2016

(87) PCT Pub. No.: WO2015/137936
PCT Pub. Date: Sep. 17, 2015

(65) Prior Publication Data
US 2016/0358848 A1 Dec. 8, 2016

(51) Int. Cl.
*H01L 23/00* (2006.01)
*H01L 23/31* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC . H01L 21/486; H01L 23/49838; H01L 23/13; H01L 23/50; H01L 2924/15159;
(Continued)

(56) References Cited

U.S. PATENT DOCUMENTS

| 6,388,207 B1 | 5/2002 | Figueroa et al. |
| 8,247,269 B1 | 8/2012 | Youg |

(Continued)

FOREIGN PATENT DOCUMENTS

| CN | 101843181 A | 9/2010 |
| CN | 103378014 A | 10/2013 |

(Continued)

OTHER PUBLICATIONS

Office Action and Search Report Received for Taiwan Patent Application No. 104101978, dated Mar. 2, 2016, 6 pages (5 pages of Taiwan Office Action including 1 page of English Translation of Search Report ).

(Continued)

*Primary Examiner* — Jasmine Clark
(74) *Attorney, Agent, or Firm* — Schwabe, Williamson & Wyatt, P.C.

(57) ABSTRACT

A microelectronic package including a passive microelectronic device disposed within a package body, wherein the package body is the portion of the microelectronic package which provides support and/or rigidity to the microelectronic package. In a flip-chip type microelectronic package, the package body may comprise a microelectronic substrate to which an active microelectronic device is electrically attached. In an embedded device type microelectronic package, the package body may comprise the material in which the active microelectronic device is embedded.

24 Claims, 11 Drawing Sheets

(51) Int. Cl.
*H01L 23/498* (2006.01)
*H01L 21/48* (2006.01)
*H01L 21/56* (2006.01)
*H01L 23/50* (2006.01)
*H01L 25/16* (2006.01)
*H01L 23/13* (2006.01)

(52) U.S. Cl.
CPC ........ *H01L 21/565* (2013.01); *H01L 23/3114* (2013.01); *H01L 23/49822* (2013.01); *H01L 23/50* (2013.01); *H01L 24/19* (2013.01); *H01L 24/20* (2013.01); *H01L 24/96* (2013.01); *H01L 25/16* (2013.01); *H01L 23/13* (2013.01); *H01L 23/49816* (2013.01); *H01L 24/16* (2013.01); *H01L 2224/04105* (2013.01); *H01L 2224/12105* (2013.01); *H01L 2224/16227* (2013.01); *H01L 2224/24195* (2013.01); *H01L 2224/32225* (2013.01); *H01L 2224/32245* (2013.01); *H01L 2224/73267* (2013.01); *H01L 2224/92244* (2013.01); *H01L 2924/15151* (2013.01); *H01L 2924/15159* (2013.01); *H01L 2924/15174* (2013.01); *H01L 2924/15192* (2013.01); *H01L 2924/15311* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC .......... H01L 2924/15151; H01L 24/19; H01L 24/96; H01L 2224/20; H01L 2224/32245; H01L 2224/92244; H01L 2924/15174; H01L 21/4853; H01L 23/3114; H01L 25/16; H01L 21/565; H01L 2924/15311; H01L 23/4334; H01L 2224/24195; H01L 2924/19105
See application file for complete search history.

(56) References Cited

U.S. PATENT DOCUMENTS

| | | | |
|---|---|---|---|
| 2001/0010398 A1* | 8/2001 | Farooq | ................... H01L 24/11 257/724 |
| 2004/0001324 A1* | 1/2004 | Ho | ..................... H01L 23/5389 361/761 |
| 2004/0227258 A1 | 11/2004 | Nakatani | |
| 2007/0210423 A1 | 9/2007 | Hsu | |
| 2008/0180919 A1* | 7/2008 | Lim | ................... H01L 23/3121 361/728 |
| 2010/0213599 A1 | 8/2010 | Wantanabe et al. | |
| 2012/0133427 A1 | 5/2012 | Kim et al. | |
| 2013/0001770 A1* | 1/2013 | Liu | ........................ H01L 24/19 257/737 |
| 2013/0175686 A1 | 7/2013 | Meyer et al. | |
| 2013/0269986 A1 | 10/2013 | Sun | |
| 2013/0292852 A1 | 11/2013 | Fuergut et al. | |
| 2016/0379933 A1* | 12/2016 | Scanlan | ............... H05K 1/0216 257/659 |

FOREIGN PATENT DOCUMENTS

| | | |
|---|---|---|
| JP | A-2003152303 | 10/2001 |
| JP | 2003-152303 | 5/2003 |
| JP | A-2010219489 | 9/2009 |
| JP | 2010-219489 | 9/2010 |
| JP | A-2012114446 | 11/2010 |
| JP | A-201439005 | 2/2013 |
| KR | 10-2008-0008255 A | 1/2008 |
| KR | 2012-0057285 | 6/2012 |

OTHER PUBLICATIONS

International Preliminary Report on Patentability and Written Opinion received for PCT Application No. PCT/US2014/024112, dated Sep. 22, 2016, 8 pages.
International Search Report with Written Opinion received for PCT Application No. PCT/US2014/024112 dated Dec. 10, 2014, 11 pages.
Official Communication (3 pages) from Taiwan Intellectual Property Office dated Dec. 9, 2016 for Taiwan Patent Application No. 1041001978.
Office Action received for Taiwan Patent Application No. 104101978, dated Nov. 18, 2016, 3 pages of Taiwan Office Action Only.
Office Action received Japan Patent Office for Japanese Patent Application No. 2016-556830, dated Apr. 25, 2017, 20 pages, with English translation thereof.
Office Action for Korean Patent Application No. 2016-7022003, dated Sep. 13, 2017, 18 pgs.
Notice of Allowance from Taiwan Patent Application No. 104101978 dated Feb. 9, 2018, 3 pages.
Notice of Allowance from Japanese Patent Application No. JP2016-556830 dated Jan. 16, 2018, 3 pages.
Office Action from Chinese Patent Application No. 201480075442.0 dated Jan. 30, 2018, 9 pages.
Search Report from European Patent Appliction No. 14885164.5 dated Oct. 18, 2017, 6 pgs.
Notice of Allowance for Korean Patent Application No. 10-2016-7022003, dated Feb. 23, 2018, 3 pages.

* cited by examiner

MICROELECTRONIC PACKAGE HAVING A PASSIVE MICROELECTRONIC DEVICE DISPOSED WITHIN A PACKAGE BODY

RELATED APPLICATION

The present application is a national stage entry of PCT Patent Application No. PCT/US2014/024112, filed on Mar. 12, 2014, entitled "MICROELECTRONIC PACKAGE HAVING A PASSIVE MICROELECTRONIC DEVICE DISPOSED WITHIN A PACKAGE BODY", which is hereby incorporated herein by reference in its entirety and for all purposes.

TECHNICAL FIELD

Embodiments of the present description generally relate to the field of microelectronic package fabrication, and, more particularly, to a microelectronic package including a surface mount device and/or an integrated passive device disposed within a package body.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. As these goals are achieved, the fabrication of the microelectronic packages becomes more challenging. One such challenging area relates to reducing the height/thickness of the microelectronic packages. Although the thickness of active microelectronic devices, such as microelectronic dice, has decreased, passive microelectronic devices, such as integrated passive devices and surface mounted devices, used in the microelectronic packages, are difficult to reduce in size. This difficulty arises from the fact that, in general, these passive microelectronic devices require specific amounts (e.g. volume) of component material in order to achieve a desired functionality, e.g. capacitance value, inductance value, etc. Thus, fabricating a thinner passive microelectronic device would either require reducing the volume of the component material, which would hamper performance, or using unconventional component materials, which may reduce the volume of component material that would be required, but may prohibitively increase the cost of the passive microelectronic device.

BRIEF DESCRIPTION OF THE DRAWINGS

The subject matter of the present disclosure is particularly pointed out and distinctly claimed in the concluding portion of the specification. The foregoing and other features of the resent disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1A:
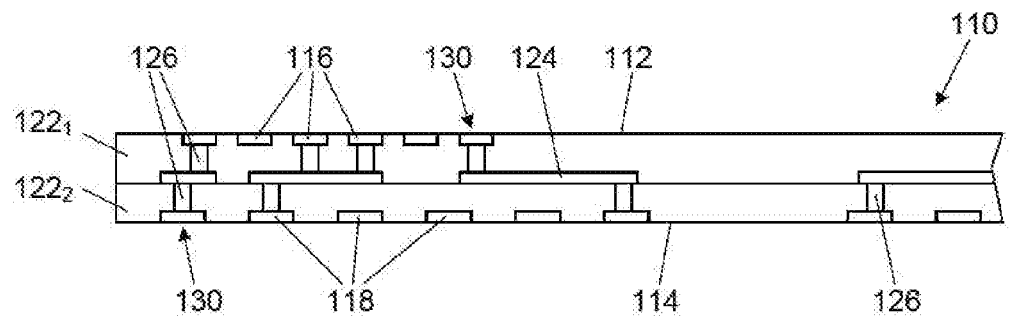
FIGS. 1A-1F illustrates cross-sectional views of processes of fabricating flip-chip type of microelectronic packages, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include to a microelectronic package having a passive microelectronic device disposed within a package body, wherein the package body is a portion of the microelectronic package which provides support and/or rigidity to the microelectronic package. In a flip-chip type microelectronic package, the package body may comprise a microelectronic substrate to which an active microelectronic device is electrically attached. In an embedded device type microelectronic package, the package body may comprise the material in which the active microelectronic device is embedded.

FIGS. 1A-1F illustrate embodiments of the present description wherein a passive device is disposed within a package body of a flip-chip type microelectronic package. As shown in FIG. 1A, a package body 110 may be formed. The package body 110 may be a microelectronic substrate, such as a motherboard, an interposer, or the like, having a first surface 112 and an opposing second surface 114. The package body 110 may have a plurality of bond pads 116 formed in or on the package body first surface 112, and a plurality of bond pads 118 formed in or on the package body second surface 114. The package body 110 may comprise a plurality of dielectric layers (illustrated as a first dielectric layer $122_1$ and a second dielectric layer $122_2$) having a plurality of conductive routes 130 formed from conductive traces 124 formed on at least one of the dielectric layers (illustrated as being formed on the second dielectric layer $122_2$) wherein connections are formed between structures, such as the conductive traces 124, the package body first surface bond pads 116, and the package body second surface bond pads 118, with conductive vias 126 formed through the various dielectric layers (illustrated as the first dielectric layer $122_1$ and the second dielectric layer $122_2$). It is understood that the conductive routes 130 may include the package body first surface bond pads 116 and the package body second surface bond pads 118.

The package body dielectric layers (illustrated as the first dielectric layer $122_1$ and the second dielectric layer $122_2$) may comprise any appropriate dielectric material, including, by not limited to, liquid crystal polymer, epoxy resin, bismaleimide triazine resin, polybenzoxazole, polyimide material, silica-filled epoxy (such as materials available from Ajinomoto Fine-Techno Co., Inc., 1-2 Suzuki-cho, Kawasaki-ku, Kawasaki-shi, 210-0801, Japan (e.g. Ajinomoto ABF-GX13, and Ajinomoto GX92)), and the like. The conductive routes 130 may be formed of any appropriate conductive material, including, but not limited to, copper, silver, gold, nickel, titanium, tungsten, and alloys thereof. The processes used for forming the package body 110 are well known to those skilled in the art, and for the sake of brevity and conciseness will not be described or illustrated herein. It is understood that the package body 110 may be formed from any number of dielectric layers, may contain a rigid core (not shown), and may contain active and/or passive microelectronic devices (not shown) formed therein. It is further understood that the conductive routes 130 could form any desired electrical route within the package body 110 and/or with additional external components (not shown). It is also understood that solder resist layers (not shown) could be utilized on the package body first surface 122 and/or the package body second surface 124, as will be understood to those skilled in the art.

Figure 1B:
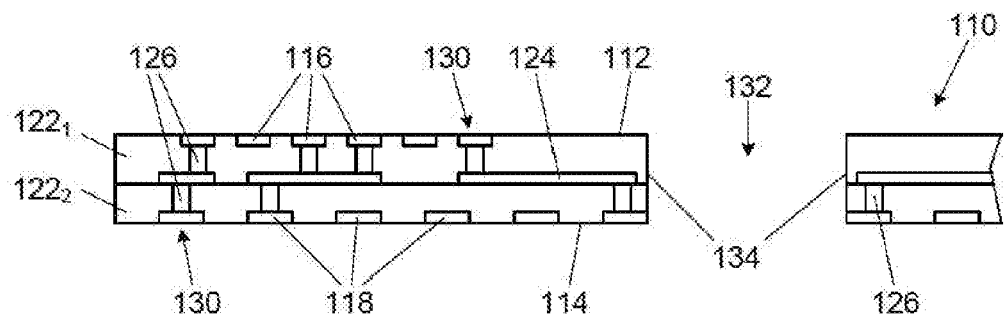

As shown in FIG. 1B, a cavity 132 may be formed in the package body 110. As illustrated, the package body cavity 132 may be formed through the package body 110 extending from the package body first surface 112 to the package body second surface 114 and forming cavity side walls 134 therebetween. The package body cavity 132 may be formed by any technique known in the art, including, but not limited to, stamping, milling, drilling, pinching, etching, and the like.

Figure 1C:
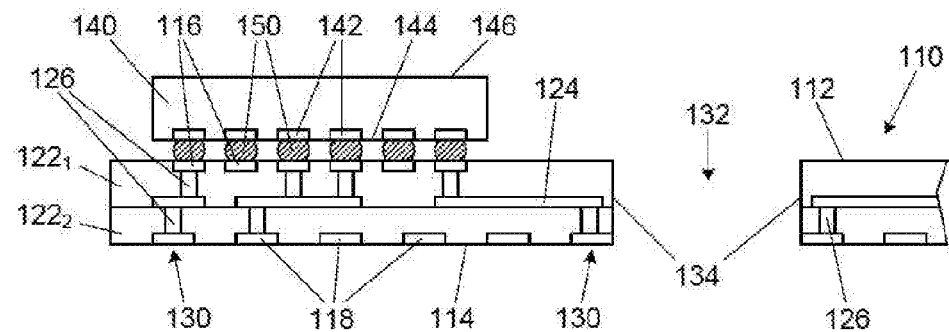

As shown in FIG. 1C, an active microelectronic device 140 may be attached to corresponding package body first surface bond pads 116 with a plurality of interconnects 150, such as reflowable solder bumps or balls, in a configuration generally known as a flip-chip or controlled collapse chip connection ("C4") configuration. The interconnects 150 may extend between package body first surface bond pads 116 and mirror-image bond pads 142 on an active surface 144 of the active microelectronic device 140 to form an electrical connection therebetween. It is understood that active microelectronic device bond pads 142 may be in electrical communication with integrated circuitry (not shown) within the active microelectronic device 140. The active microelectronic device 140 may be any appropriate microelectronic device, including, but not limited to a microprocessor, a chipset, a graphics device, a wireless device, a memory device, an application specific integrated circuit device, and the like. It is also understood that an underfill material (not shown) could be disposed between the active microelectronic device and the package body 110, and that solder resist layers (not shown) could be utilized on the package body first surface 112 and/or the package body second surface 114, as will be understood to those skilled in the art.

Figure 1D:
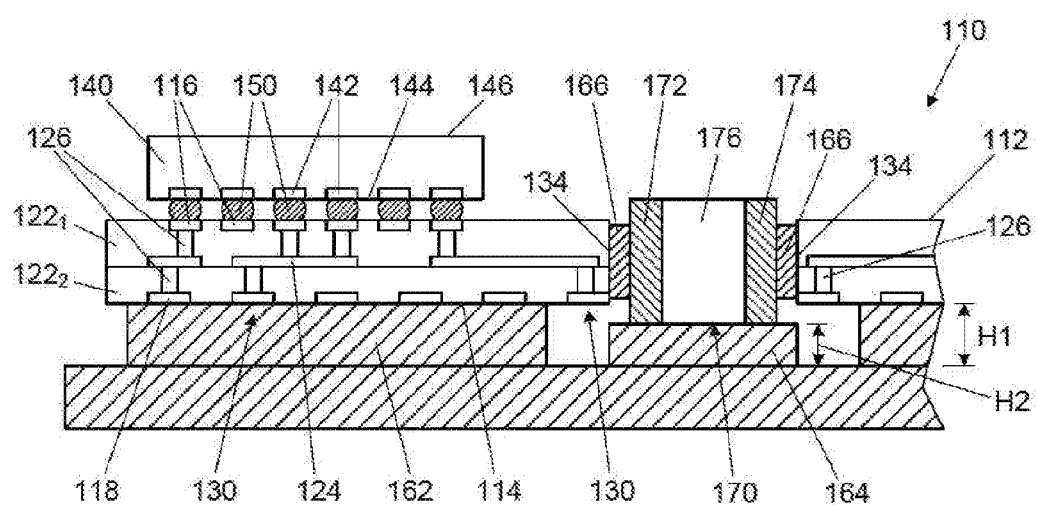

As shown in FIG. 1D, the package body 110 may be placed on a carrier 160 having at least one package body protrusion 162 and at least one passive microelectronic device protrusion 164, wherein a passive microelectronic device 170 may be placed in the package body cavity 132 (see FIG. 1C) to contact the carrier passive microelectronic device protrusion 164. The carrier package body protrusions 162 and carrier passive Microelectronic device protrusion 164 may have differing heights H1 and H2, respectively, to place the passive microelectronic device 170 in an appropriate position within the package body cavity 132 (see FIG. 1C). As further shown in FIG. 1D, an adhesive material 166 may be applied between the cavity side walls 134 and the passive microelectronic device 170 to secure the passive microelectronic device 170 in place. For the purposes of this detailed description, the passive microelectronic device 170 is defined to be a surface mount device or an integrated passive device, which comprises at least two electrical terminals 172, 174 on opposing sides of a functional passive component 176, as will be understood to those skilled in the art. The passive microelectronic device 170 may comprise any appropriate device, including, but not limited to resistors, capacitors, inductors, impedance matching circuits, harmonic filters, couplers, baluns, and the like.

Figure 1E:
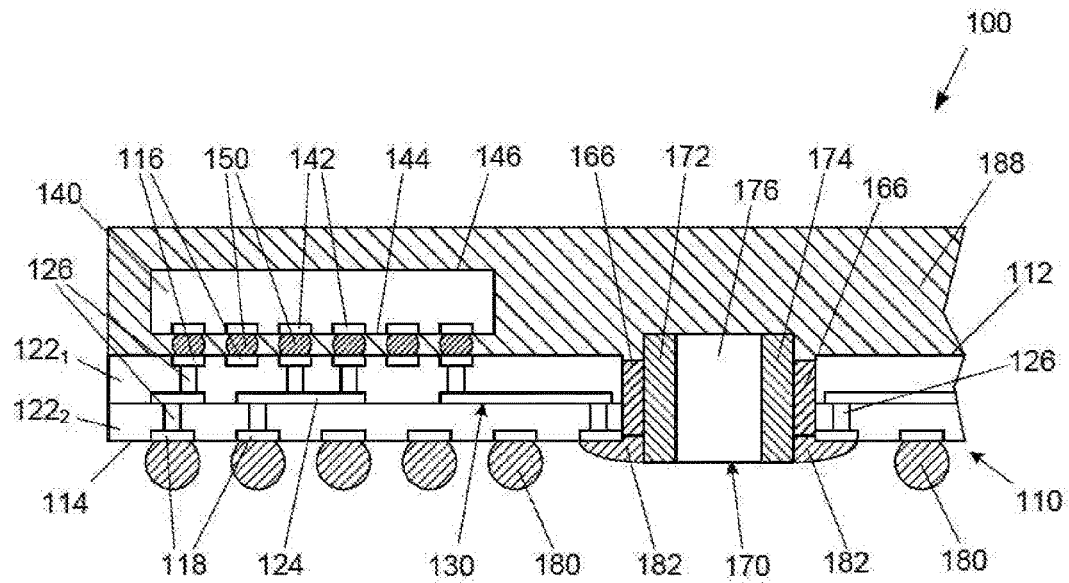

As shown in FIG. 1E, the carrier 160 (see FIG. 1D) may be removed and external interconnects 180, shown as reflowable solder balls, may be formed on appropriate package body second surface bond pads 118 and a conductive material connection 182 may be made between each passive microelectronic device electrical terminal 172, 174 and its corresponding package body second surface bond pad 118. The external interconnects 180 and the conductive material connections 182 may be formed simultaneously, such as by a solder paste printing technique followed by reflowing the solder paste. However, the conductive material connections 182 may be made in a separate step, such as by a solder paste dispensing technique, a ink jetting technique, or the like, followed by reflowing the solder paste. As further shown in FIG. 1E, an encapsulation material 188 may be formed, such as by a molding technique, over the package body first surface 112 and the active microelectronic device 140 to form a microelectronic package 100.

Figure 1F:
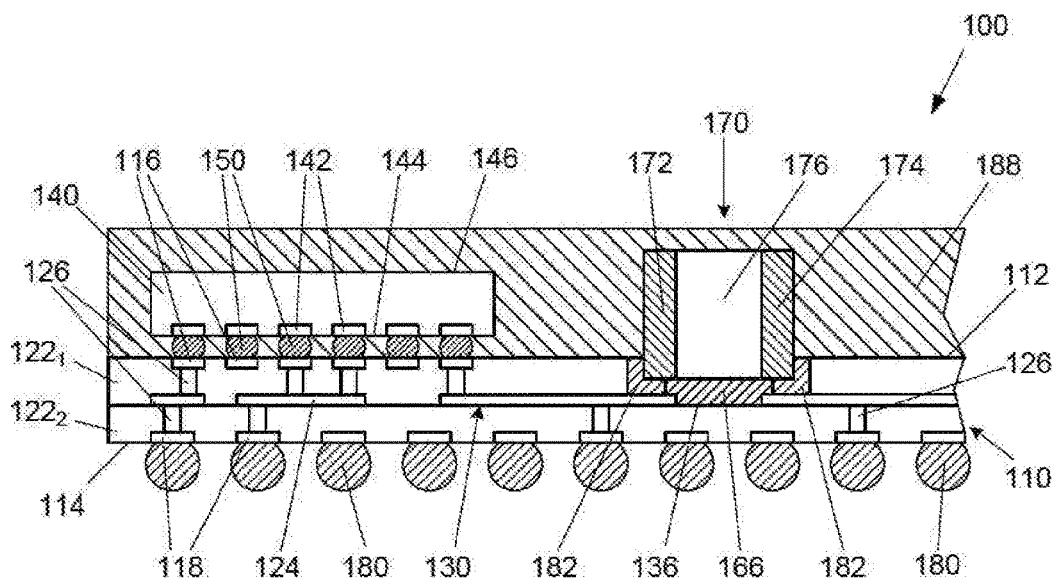

In another embodiment, as shown in FIG. 1F, the package body cavity 132 may extend partially into the package body 110 from the package body first surface 112, which forms a cavity bottom surface 136 and exposes a plurality of conductive traces 124. The passive microelectronic device 170 may be place in the package body cavity 132 with a conductive material connection 182 may be made between each passive microelectronic device electrical terminal 172, 174 and its corresponding conductive trace 124. The processing steps for the microelectronic package 100 shown in FIG. 1F will be evident from the above description with regard to FIGS. 1A-1E and known techniques.

Figure 2A:
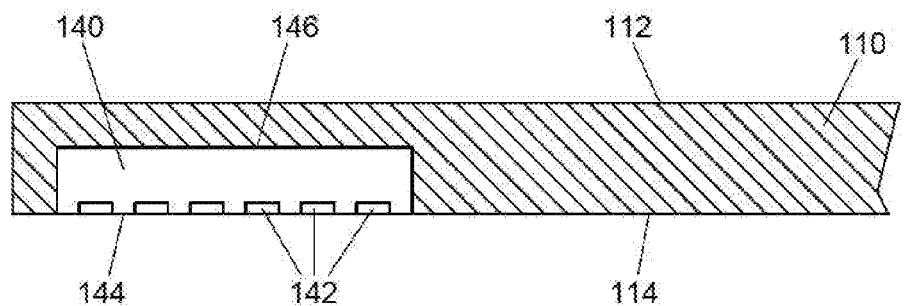
FIGS. 2A-2F illustrates cross-sectional views of processes of fabricating embedded technology type of microelectronic packages, according to another embodiment of the present description.

FIGS. 2A-2F illustrate embodiments of the present description wherein the active microelectronic device 140 and the passive microelectronic device 170 are disposed within the package body 110. As shown in FIG. 2A, the active microelectronic device 140 may be embedded in the package body 110, such that the active microelectronic device active surface 144 is substantially planar to the package body second surface 114. The structure shown in FIG. 2A may be achieved with a variety of techniques, including, but not limited to, lamination and molding, which may be parts of processes known as, embedded die package processing and fan-out wafer level package processing. The package body 110 may be made of any appropriate encapsulant material, including, but not limited to, polymer materials.

Figure 2B:
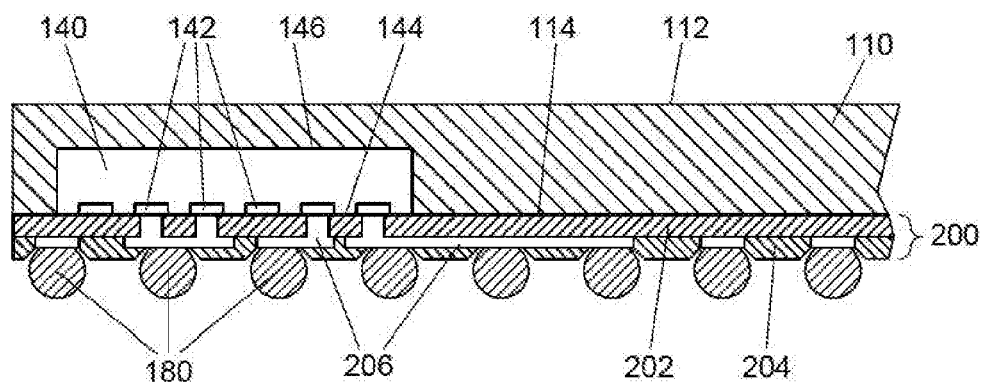

As shown in FIG. 2B, a redistribution layer 200 may be formed on the active microelectronic device active surface 144 and the package body second surface 114. The redistribution layer 200 may comprise a plurality of dielectric layers (shown as a first dielectric layer 202 and a second dielectric 204) and the plurality of conductive routes 206. The first dielectric layer 202 may be formed on the active microelectronic device active surface 144 and the package body second surface 114. The plurality of conductive routes 206 may be formed on the first dielectric layer 202, wherein at least a portion of the plurality of conductive routes 206 extend through the first dielectric layer 202 to contact corresponding active microelectronic device bond pads 142. The second dielectric layer 204, such as a solder resist layer, may be formed on the first dielectric layer 202 and the plurality of conductive routes 206. External interconnects 180, shown as reflowable solder balls, may be formed within openings through the second dielectric layer 204 to contact corresponding conductive routes 206. It is understood, that the first dielectric layer 202 is optional when the package body 110 is sufficiently dielectric.

Figure 2C:
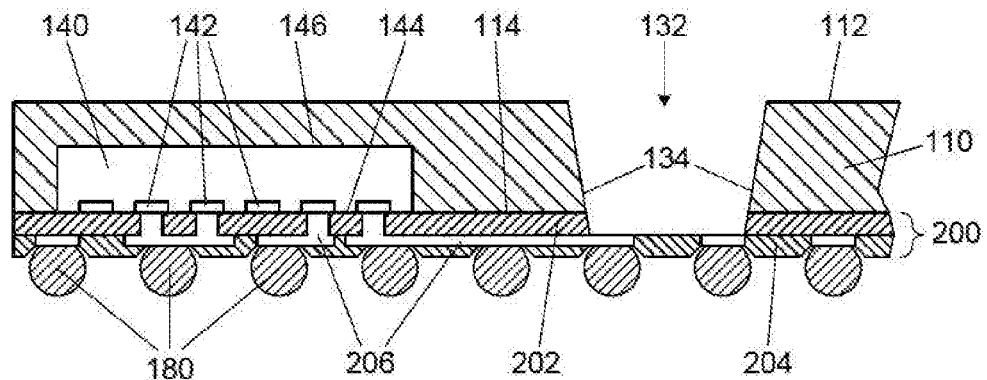

As shown in FIG. 2C, the package body cavity 132 may be formed through the package body 110 extending from the package body first surface 112 to the package body second surface 114 and may extend partially into the redistribution layer 200 and expose appropriate conductive routes 206. The package body cavity 132 may be formed by any technique known in the art, including, but not limited to, stamping, milling, drilling, pinching, etching, and the like, or combinations thereof.

Figure 2D:
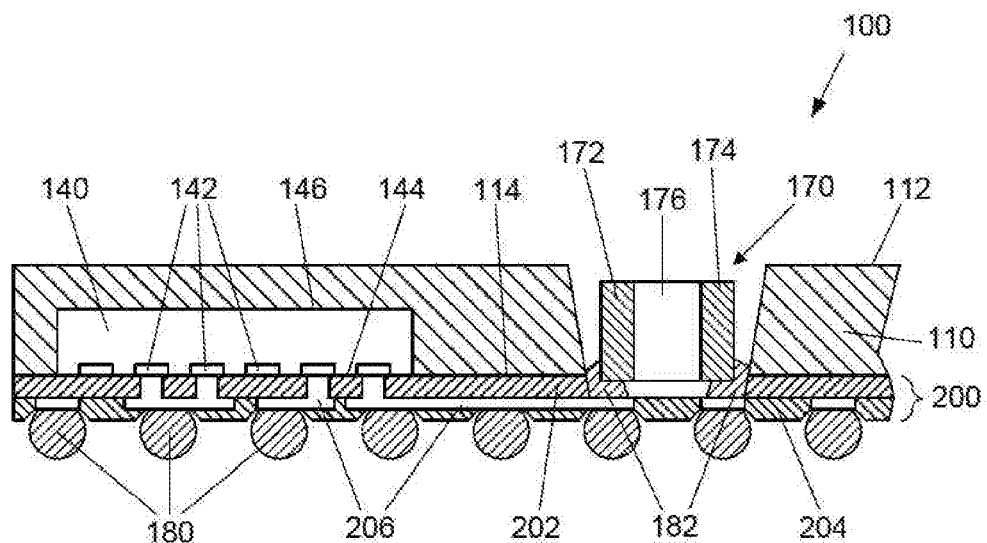

As shown in FIG. 2D, the passive microelectronic device 170 may be placed in the package body cavity 132 (see FIG. 2C) with the conductive material connection 182 between each passive microelectronic device electrical terminal 172, 174 and its corresponding conductive route 206.

Figure 2E:
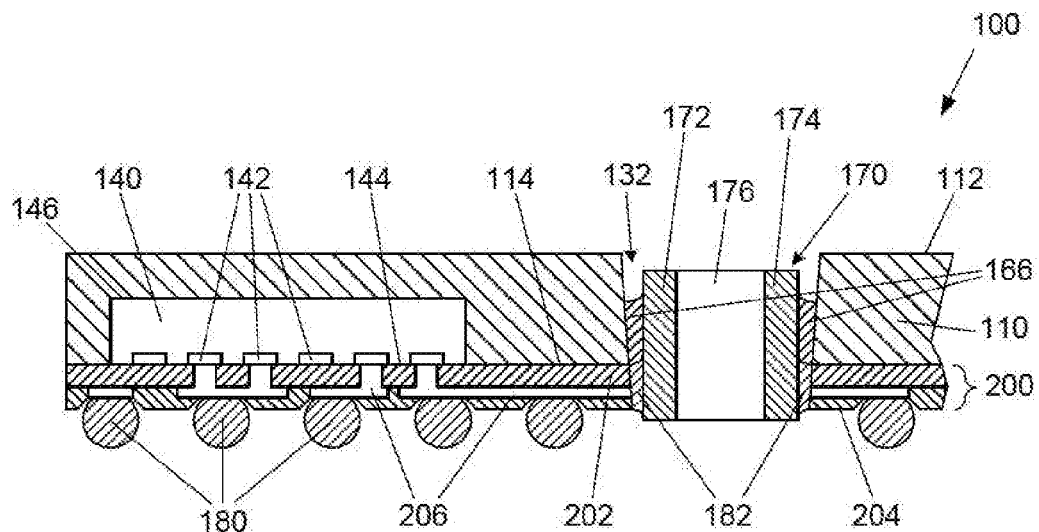

In another embodiment, as shown in FIG. 2E, the package body cavity 132 may also extend through the redistribution layer 200 and the passive microelectronic device 170 may be placed to extend through the package body cavity 132 and the redistribution layer 200 with the conductive material connection 182 between each passive microelectronic device electrical terminal 172, 174 and its corresponding conductive route 206. The adhesive material 166 may be applied between the cavity side walls 134 and the passive microelectronic device 170 to secure the passive microelectronic device 170 in place.

Figure 2F:
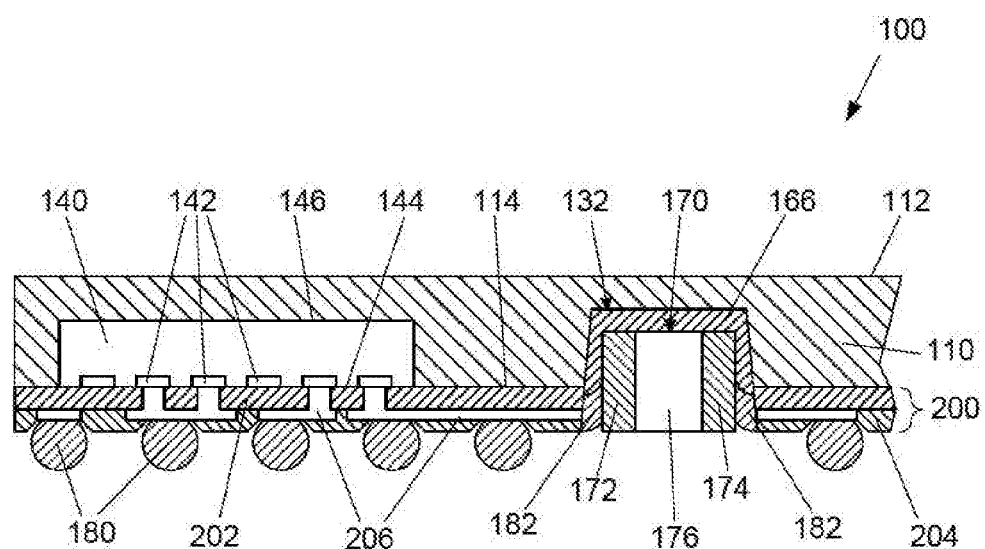

In still another embodiment, as shown in FIG. 2F, the package body cavity 132 may formed through the redistribution layer 200 and extend partially into the package body 110 from the package body second surface 114. The adhesive material 166 may be applied between the cavity side walls 134 and the passive microelectronic device 170 to secure the passive microelectronic device 170 in place and the conductive material connection 182 may be formed between each passive microelectronic device electrical terminal 172, 174 and its corresponding conductive route 206.

Figure 3A:
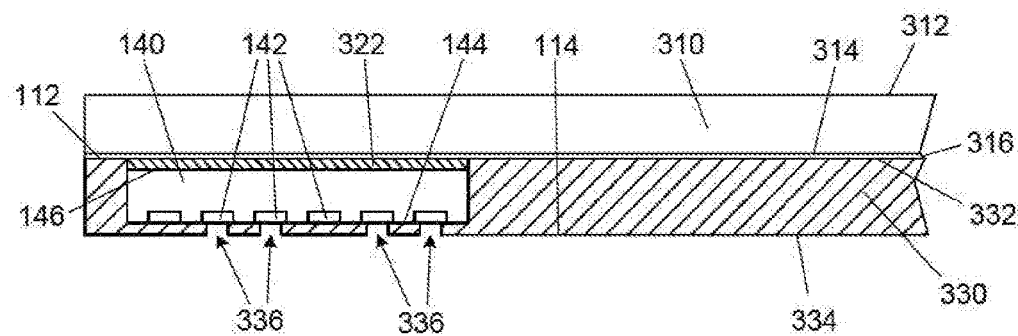
FIGS. 3A-3F illustrates cross-sectional view of processes of fabricating embedded technology type of microelectronic package, according to yet another embodiment of the present description.

FIGS. 3A-3F illustrate embodiments of the present description wherein the active microelectronic device 140 is disposed within the package body 110, which comprises a dielectric encapsulant 330 and a support plate 310. As shown in FIG. 3A, the support plate 310 may be formed having a first surface 312 and an opposing second surface 314, wherein the support plate 310 may optionally include a dielectric material layer 316 formed on the support plate second surface 314. A back surface 146 of the active microelectronic device 140 may be attached with an attachment adhesive 322 to the support plate 310 (illustrated with the attachment adhesive 322 contacting the support plate dielectric material layer 316). As further shown in FIG. 3A, the dielectric encapsulant 330 may be formed adjacent the support plate 310 and embedding the active microelectronic device 140 including the active microelectronic device active surface 144, wherein a dielectric encapsulant first surface 332 may be defined adjacent the support plate 310 and a dielectric encapsulant second surface 334 may be defined opposing the encapsulant first surface 332. As still further shown in FIG. 3A, openings 336 may be formed to extend from the dielectric encapsulant second surface 334 to corresponding active microelectronic device bond pads 142. The openings 336 may be formed by any technique known in the art, including, but not limited to, laser drilling, photolithography, and ion bombardment.

The support plate 310 may comprise any appropriate rigid material, including, but not limited to, metals, polymers, ceramics, and the like, as well as combinations thereof and combinations with different material classes. The dielectric encapsulant 330 may be made of any appropriate dielectric material, including, but not limited to, polymer materials, and may be formed by any known technique, including, but not limited to spin coating, lamination, printing, molding, and the like.

Figure 3B:
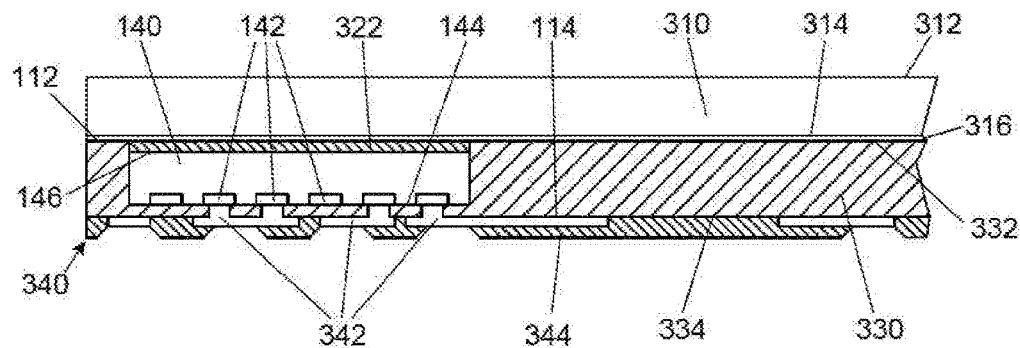

As shown in FIG. 3B, a redistribution layer 340 may be formed on the dielectric encapsulant second surface 334. The redistribution layer 340 may comprise a plurality of conductive routes 342 formed on the dielectric encapsulant second surface 334, wherein at least a portion of the plurality of conductive routes 342 extend into the dielectric encapsulant openings 336 (see FIG. 3A). The redistribution layer 340 may further comprise a dielectric layer 344, such as a solder resist layer, which may be formed on the dielectric encapsulant second surface 334 and the plurality of conductive routes 342.

Figure 3C:
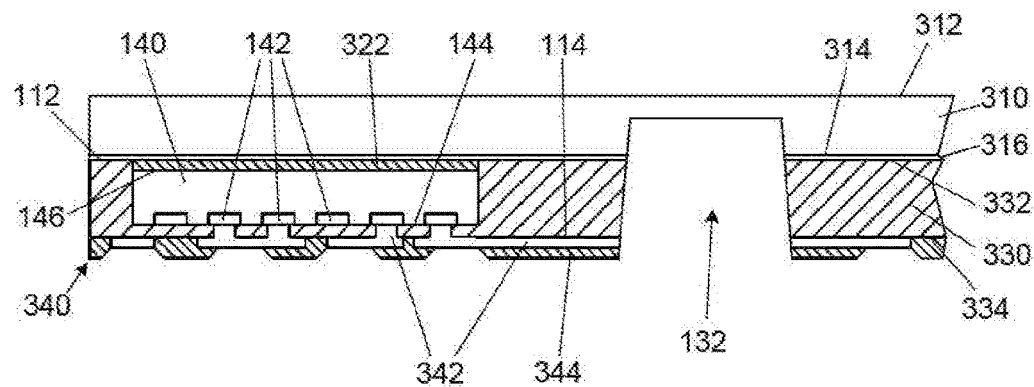
Figure 3D:
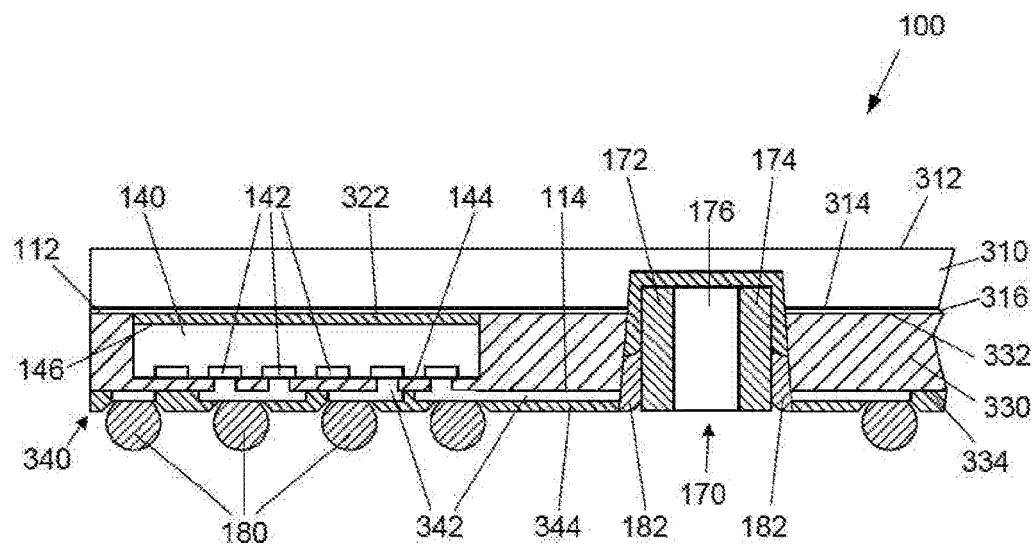

As shown in FIG. 3C, the package body cavity 132 may formed through the redistribution layer 340, through the dielectric encapsulant 330, and extending partially into the support plate 310. As shown in FIG. 3D, the adhesive material 166 may be applied to secure the passive microelectronic device 170 in place. External interconnects 180, shown as reflowable solder balls, may be formed within openings through the dielectric layer 344 to contact corresponding conductive routes 342 and the conductive material connection 182 may be made between each passive microelectronic device electrical terminal 172, 174 and its corresponding conductive routes 342. The external interconnects 180 and the conductive material connections 182 may be formed simultaneously, such as by a solder paste printing technique followed by reflowing the solder paste. However, the conductive material connections 182 may be made in a separate step, such as by a solder paste printing or dispensing technique, an ink jetting technique, or the like, followed by reflowing the solder paste.

Figure 3E:
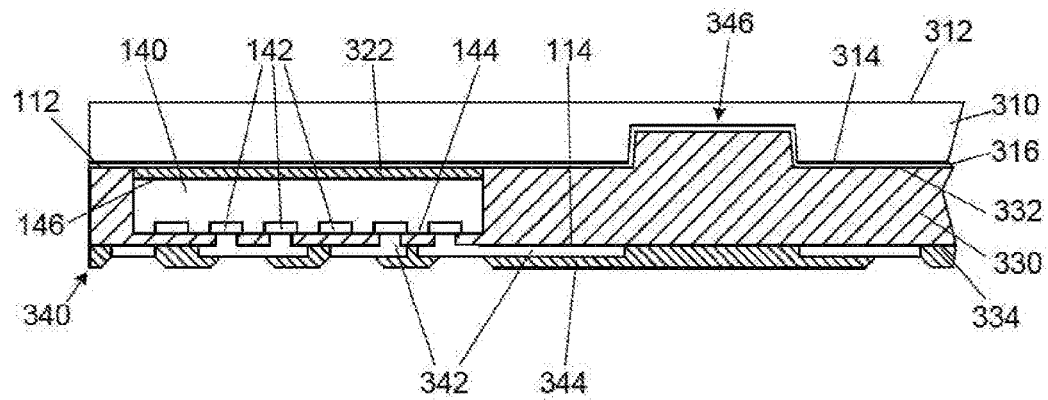
Figure 3F:
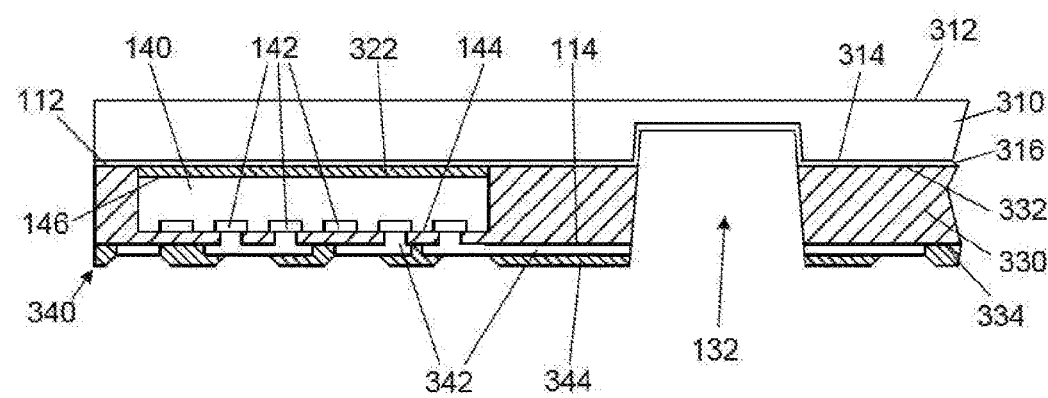

It is understood, as shown in FIG. 3E, a recess 346 could be pre-formed in the support plate 310, such that the dielectric encapsulant 330 extends therein when deposited. Thus, only one material (i.e. the dielectric encapsulant 330) need be removed in the formation of the package body cavity 132, as shown in FIG. 3F.

It is further understood that the package body cavity 132 could extend entirely through the support plate 310 and dielectric encapsulant 330, such as demonstrate with regard to other embodiment of the present detailed description.

It is understood that the embodiments of the present description may have advantages over fully embedding the passive microelectronic device 170 in the package body 110, as the passive microelectronic device 170 may extend beyond the package body first surface 112 and/or the package body second surface 114, thereby allowing for the formation of a thinner package body relative to the thickness of a package body having a fully embedded passive microelectronic device.

Figure 4:
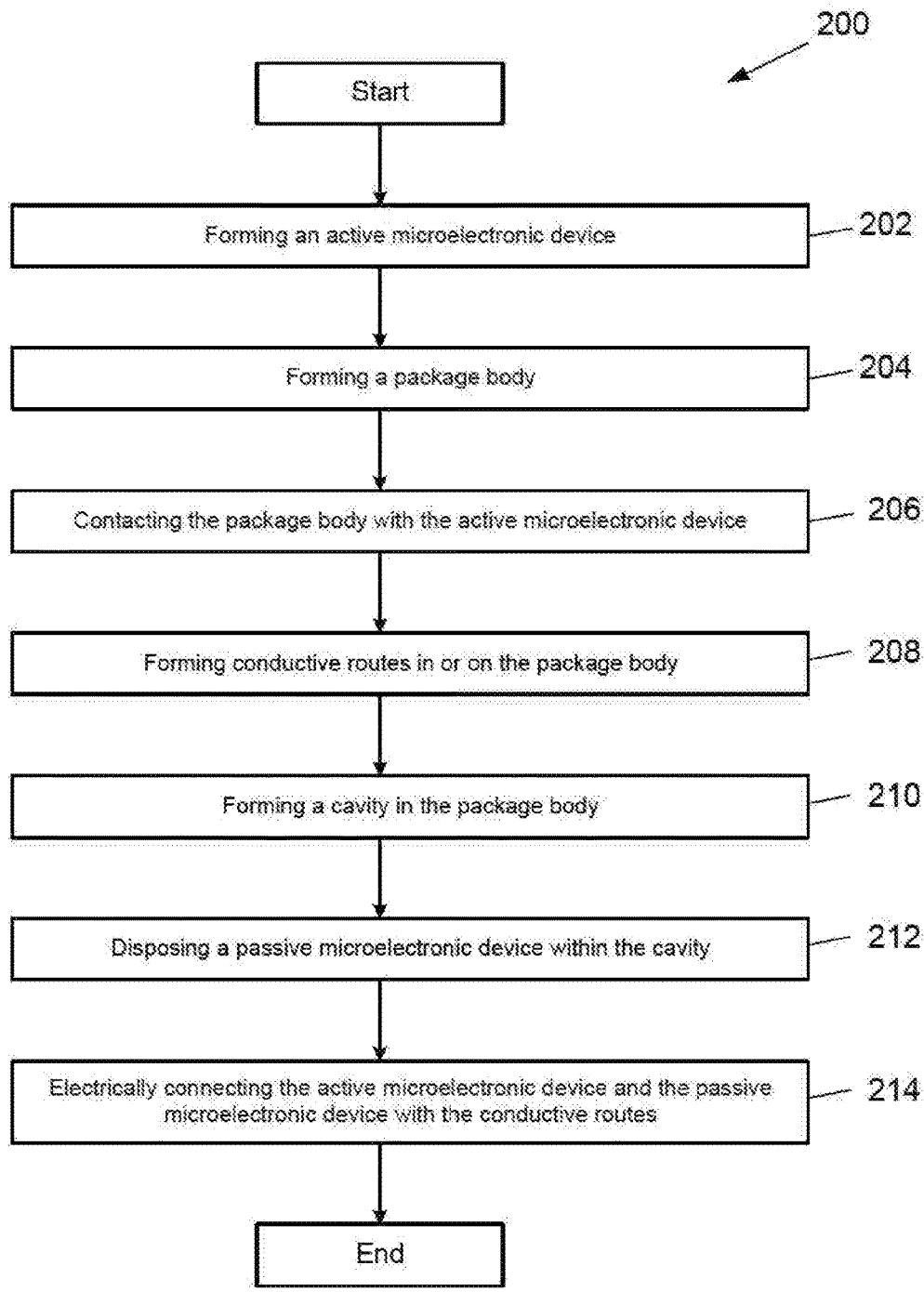
FIG. 4 is a flow chart of a process of fabricating a microelectronic structure, according to an embodiment of the present description.

FIG. 4 is a flow chart of a process 200 of fabricating a microelectronic structure according to an embodiment of the present description. As set forth in block 202, an active microelectronic device substrate may be formed. A package body may be formed, as set forth in block 204. As set forth in block 206, the package body may contacted with the active microelectronic device. Conductive routes may be formed in or on the package body, as set in block 208. As set forth in block 210, a cavity may be formed in the package body. A passive microelectronic device may be disposed within the cavity, as set forth in block 212. As set forth in block 214, the active microelectronic device and the passive microelectronic device may be electrically connected with the conductive routes.

Figure 5:
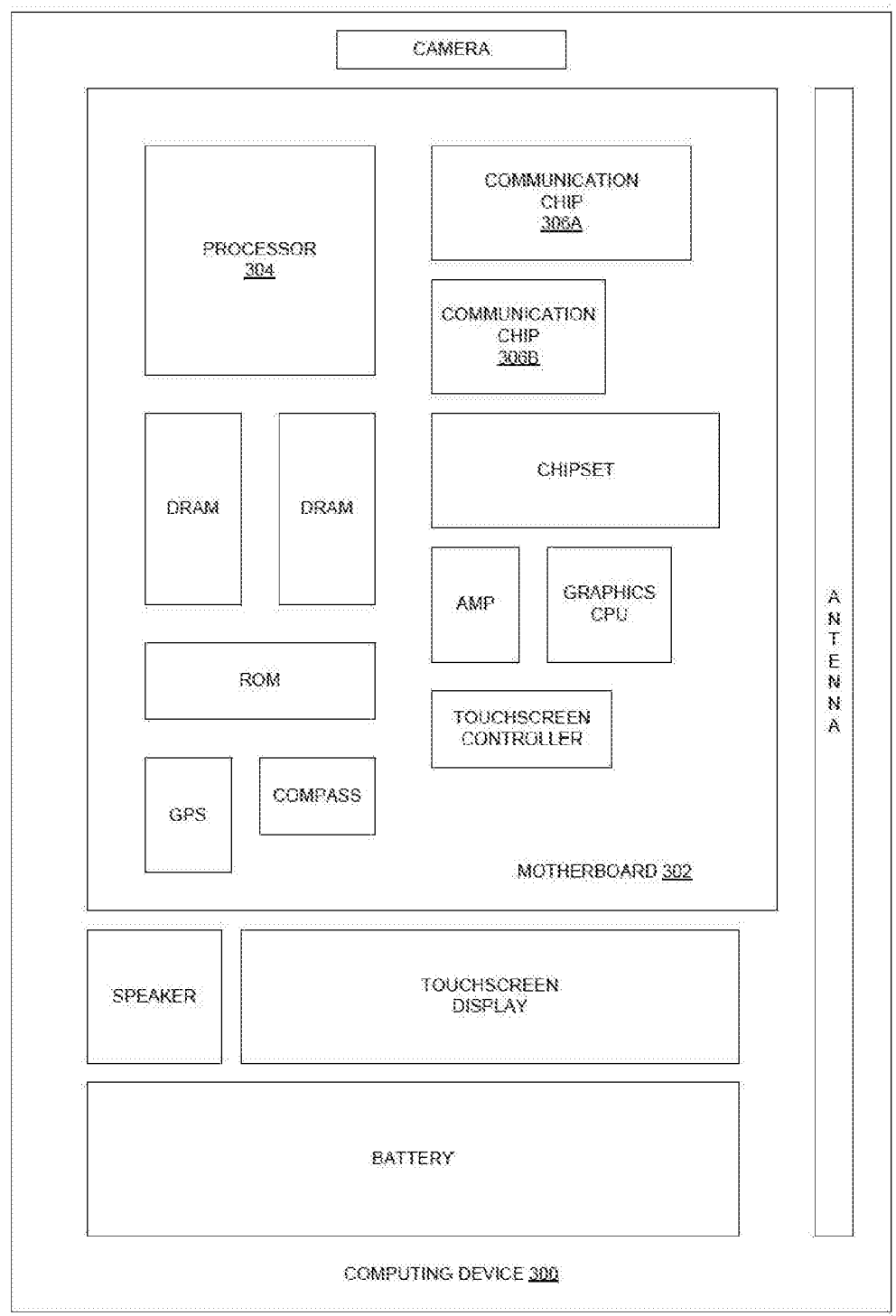
FIG. 5 illustrates a computing device in accordance with one implementation of the present description.

FIG. 5 illustrates a computing device 300 in accordance with one implementation of the present description. The computing device 300 houses a board 302. The board 302 may include a number of components, including but not limited to a processor 304 and at least one communication chip 306A, 306B. The processor 304 is physically and electrically coupled to the board 302. In some implementations the at least one communication chip 306A, 306B is also physically and electrically coupled to the board 302. In further implementations, the communication chip 306A, 306B is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306A, 306B enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306A, 306B. For instance, a first communication chip 306A may be dedicated to shorter range wireless communications such as Wi-Fi and Bluetooth and a second communication chip 306B may be dedicated to longer range wireless communications such as GPS, EDGE, GPRS, CDMA, WiMAX, LTE, Ev-DO, and others.

The processor 304 of the computing device 300 may include a microelectronic package having a plurality microelectronic devices, both active and passive, packaged therein. In some implementations of the present description, a passive microelectronic device of the processor 304 may be disposed within a package body, as described above. The term "processor" may refer to any device or portion of a device that processes electronic data from registers and/or memory to transform that electronic data into other electronic data that may be stored in registers and/or memory.

The communication chip 306A, 306B may include a microelectronic package having a plurality microelectronic devices, both active and passive, packaged therein. In accordance with another implementation of the present description, a passive microelectronic device of the communication chip 306A, 306B may be disposed within a package body, as described above.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1A-5. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a microelectronic package may comprise an active microelectronic device in contact with a package body; and a passive microelectronic device disposed within a cavity formed in the package body; wherein the active microelectronic device and the passive microelectronic device are electrically connected by conductive routes formed in or on the package body.

In Example 2, the subject matter of Example 1 can optionally include the cavity extending through the package body from a first surface of the package body to a second surface of the package body.

In Example 3, the subject matter of Example 1 or 2 can optionally include the active microelectronic device comprising a flip-chip microelectronic device and the package body comprises a microelectronic substrate, wherein the flip-chip microelectronic device is in contact with the microelectronic substrate through a plurality of interconnects extending therebetween.

In Example 4, the subject matter of Example 1 or 2 can optionally include the active microelectronic device embedded in the package body and wherein an active surface of the active microelectronic device is substantially planar to a second surface of the package body.

In Example 5, the subject matter of Example 4 can optionally include the conductive routes being formed in a redistribution layer formed on the active microelectronic device active surface and the package body second surface.

In Example 6, the subject matter of Example 1 can optionally include the package body comprising a support plate and a dielectric encapsulant, wherein a back surface of the active microelectronic device is adhered to the support plate and wherein the active microelectronic device is embedded in the dielectric encapsulant with a portion of the dielectric encapsulant extends over the active microelectronic device active surface.

In Example 7, the subject matter of Example 6 can optionally include the conductive routes being formed in a redistribution layer formed on the package body second surface.

In Example 8, the subject matter of Example 7 can optionally include the cavity extending through the redistribution layer, through the dielectric encapsulant, and partially into the support plate.

In Example 9, a method of fabricating a microelectronic package may comprise forming an active microelectronic device; forming a package body; contacting the package body with the active microelectronic device; forming conductive routes in or on the package body; forming a cavity in the package body; disposing a passive microelectronic device within the cavity; and electrically connecting the active microelectronic device and the passive microelectronic device with the conductive routes.

In Example 10, the subject matter of Example 9 can optionally include forming the cavity in the package body comprising forming the cavity to extend through the package body from a first surface of the package body to a second surface of the package body.

In Example 11, the subject matter of Example 9 or 10 can optionally include forming the microelectronic device comprising forming a flip-chip microelectronic device, wherein forming the package body comprises forming a microelectronic substrate, and wherein the microelectronic device is in contact with the microelectronic substrate through a plurality of interconnects extending between the flip-chip microelectronic device and the microelectronic substrate.

In Example 12, the subject matter of Example 9 or 10 can optionally include forming the package body and contacting the package body with the active microelectronic device comprising embedding the microelectronic device in the package body such that an active surface of the microelectronic device is substantially planar to a second surface of the package body.

In Example 13, the subject matter of Example 12 can optionally include forming conductive routes in or on the package body comprising forming in a redistribution layer formed on the microelectronic device active surface and the package body second surface.

In Example 14, the subject matter of Example 9 can optionally include forming the package body comprising forming a support plate and forming a dielectric encapsulant, wherein a back surface of the active microelectronic device is adhered to the support plate and wherein the active microelectronic device is embedded in the dielectric encapsulant with a portion of the dielectric encapsulant extending over the active microelectronic device active surface.

In Example 15, the subject matter of Example 14 can optionally include forming conductive routes in or on the package body comprising forming conductive routes in a redistribution layer formed on the package body second surface.

In Example 16, the subject matter of Example 15 can optionally include forming the cavity in the package body comprising forming the cavity to extend through the redistribution layer, through the dielectric encapsulant, and partially into the support plate.

In Example 17, a computing device may comprise a board; and a microelectronic package attached to the board, wherein the microelectronic package comprises an active microelectronic device in contact with a package body; and a passive microelectronic device disposed within a cavity formed in the package body; wherein the active microelectronic device and the passive microelectronic device are electrically connected by conductive routes formed in or on the package body.

In Example 18, the subject matter of Example 17 can optionally include the cavity extending through the package body from a first surface of the package body to a second surface of the package body.

In Example 19, the subject matter of Example 17 or 18 can optionally include the active microelectronic device comprising a flip-chip microelectronic device and the package body comprises a microelectronic substrate, wherein the flip-chip microelectronic device is in contact with the microelectronic substrate through a plurality of interconnects extending therebetween.

In Example 20, the subject matter of Example 17 or 18 can optionally include the active microelectronic device embedded in the package body and wherein an active surface of the active microelectronic device is substantially planar to a second surface of the package body.

In Example 21, the subject matter of Example 20 can optionally include the conductive routes being formed in a redistribution layer formed on the active microelectronic device active surface and the package body second surface.

In Example 22, the subject matter of Example 17 can optionally include the package body comprising a support plate and a dielectric encapsulant, wherein a back surface of the active microelectronic device is adhered to the support plate and wherein the active microelectronic device is embedded in the dielectric encapsulant with a portion of the dielectric encapsulant extends over the active microelectronic device active surface.

In Example 23, the subject matter of Example 22 can optionally include the conductive routes being formed in a redistribution layer formed on the package body second surface.

In Example 24, the subject matter of Example 23 can optionally include the cavity extending through the redistribution layer, through the dielectric encapsulant, and partially into the support plate.

Having thus described in detail embodiments of the present description, it is understood that the present description defined by the appended claims is not to be limited by particular details set forth in the above description, as many apparent variations thereof are possible without departing from the spirit or scope thereof.

The invention claimed is:

1. A microelectronic package comprising:
an active microelectronic device in contact with a package body; and
a passive microelectronic device disposed within a cavity formed in the package body wherein the cavity extends through the package body from a first surface of the package body to a second surface of the package body;
wherein the active microelectronic device and the passive microelectronic device are electrically connected by conductive routes formed in or on the package body, wherein the package body comprises a support plate and a dielectric encapsulant, wherein a back surface of the active microelectronic device is adhered to the support plate and wherein the active microelectronic device is embedded in the dielectric encapsulant with a portion of the dielectric encapsulant extends over the active microelectronic device active surface.

2. The microelectronic package of claim 1, wherein the active microelectronic device comprises a flip-chip microelectronic device and the package body comprises a microelectronic substrate, wherein the flip-chip microelectronic device is in contact with the microelectronic substrate through a plurality of interconnects extending therebetween.

3. The microelectronic package of claim 1, wherein the active microelectronic device is embedded in the package body and wherein an active surface of the active microelectronic device is substantially planar to a second surface of the package body.

4. The microelectronic package of claim 3, wherein the conductive routes are formed in a redistribution layer formed on the active microelectronic device active surface and the package body second surface.

5. The microelectronic package of claim 1, wherein the conductive routes are formed in a redistribution layer formed on the package body second surface.

6. The microelectronic package of claim 5, wherein the cavity extends through the redistribution layer, through the dielectric encapsulant, and partially into the support plate.

7. A method of fabricating a microelectronic package comprising:
forming an active microelectronic device;
forming a package body;
contacting the package body with the active microelectronic device;
forming conductive routes in or on the package body wherein the forming the cavity in the package body comprises forming the cavity to extend through the package body from a first surface of the package body to a second surface of the package body;
forming a cavity in the package body;
disposing a passive microelectronic device within the cavity; and
electrically connecting the active microelectronic device and the passive microelectronic device with the conductive routes, wherein forming the package body comprises forming a support plate and forming a dielectric encapsulant, wherein a back surface of the active microelectronic device is adhered to the support plate and wherein the active microelectronic device is embedded in the dielectric encapsulant with a portion of the dielectric encapsulant extending over the active microelectronic device active surface.

8. The method of claim 7, wherein the forming the microelectronic device comprises forming a flip-chip microelectronic device, wherein forming the package body comprises forming a microelectronic substrate, and wherein the microelectronic device is in contact with the microelectronic substrate through a plurality of interconnects extending between the flip-chip microelectronic device and the microelectronic substrate.

9. The method of claim 7, wherein forming the package body and contacting the package body with the active microelectronic device comprises embedding the microelectronic device in the package body such that an active surface of the microelectronic device is substantially planar to a second surface of the package body.

10. The method of claim 9, wherein forming conductive routes in or on the package body comprises forming in a redistribution layer formed on the microelectronic device active surface and the package body second surface.

11. The method of claim 7, wherein forming conductive routes in or on the package body comprises forming conductive routes in a redistribution layer formed on the package body second surface.

12. The method of claim 11, wherein the forming the cavity in the package body comprises forming the cavity to extend through the redistribution layer, through the dielectric encapsulant, and partially into the support plate.

13. A computing device, comprising:
a board; and
a microelectronic package attached to the board, wherein the microelectronic package comprises:
an active microelectronic device in contact with a package body; and
a passive microelectronic device disposed within a cavity formed in the package body, wherein the cavity extends through the package body from a first surface of the package body to a second surface of the package body;
wherein the active microelectronic device and the passive microelectronic device are electrically connected by conductive routes formed in or on the package body, wherein the package body comprises a support plate and a dielectric encapsulant, wherein a back surface of the active microelectronic device is adhered to the support plate and wherein the active microelectronic device is embedded in the dielectric encapsulant with a portion of the dielectric encapsulant extends over the active microelectronic device active surface.

14. The computing device of claim 13, wherein the active microelectronic device comprises a flip-chip microelectronic device and the package body comprises a microelectronic substrate, wherein the flip-chip microelectronic device is in contact with the microelectronic substrate through a plurality of interconnects extending therebetween.

15. The computing device of claim 13, wherein the active microelectronic device is embedded in the package body and wherein an active surface of the active microelectronic device is substantially planar to a second surface of the package body.

16. The computing device of claim 15, wherein the conductive routes are formed in a redistribution layer formed on the active microelectronic device active surface and the package body second surface.

17. The computing device of claim 13, wherein the conductive routes are formed in a redistribution layer formed on the package body second surface.

18. The computing device of claim 17, wherein the cavity extends through the redistribution layer, through the dielectric encapsulant, and partially into the support plate.

19. A microelectronic package comprising:
an active microelectronic device in contact with a package body; and
a passive microelectronic device disposed within a cavity formed in the package body;
wherein the active microelectronic device and the passive microelectronic device are electrically connected by conductive routes formed in or on the package body, wherein the package body comprises a support plate and a dielectric encapsulant, wherein a back surface of the active microelectronic device is adhered to the support plate and wherein the active microelectronic device is embedded in the dielectric encapsulant with a portion of the dielectric encapsulant extends over the active microelectronic device active surface, wherein the conductive routes are formed in a redistribution layer formed on the package body second surface, wherein the cavity extends through the redistribution layer, through the dielectric encapsulant, and partially into the support plate.

20. A method of fabricating a microelectronic package comprising:
forming an active microelectronic device;
forming a package body;
contacting the package body with the active microelectronic device;
forming conductive routes in or on the package body;
forming a cavity in the package body;
disposing a passive microelectronic device within the cavity; and
electrically connecting the active microelectronic device and the passive microelectronic device with the conductive routes wherein forming the package body comprises forming a support plate and forming a dielectric encapsulant, wherein a back surface of the active microelectronic device is adhered to the support plate and wherein the active microelectronic device is embedded in the dielectric encapsulant with a portion of the dielectric encapsulant extending over the active microelectronic device active surface, wherein forming conductive routes in or on the package body comprises forming conductive routes in a redistribution layer formed on the package body second surface, wherein the forming the cavity in the package body comprises forming the cavity to extend through the redistribution layer, through the dielectric encapsulant, and partially into the support plate.

21. A computing device, comprising:
a board; and
a microelectronic package attached to the board, wherein the microelectronic package comprises:
an active microelectronic device in contact with a package body; and
a passive microelectronic device disposed within a cavity formed in the package body;
wherein the active microelectronic device and the passive microelectronic device are electrically connected by conductive routes formed in or on the package body, wherein the package body comprises a support plate and a dielectric encapsulant, wherein a back surface of the active microelectronic device is adhered to the support plate and wherein the active microelectronic device is embedded in the dielectric encapsulant with a portion of the dielectric encapsulant extends over the active microelectronic device active surface, wherein the conductive routes are formed in a redistribution layer formed on the package body second surface, wherein the cavity extends through the redistribution layer, through the dielectric encapsulant, and partially into the support plate.

22. A microelectronic package comprising:
an active microelectronic device in contact with a package body; and
a passive microelectronic device disposed within a cavity formed in the package body wherein the cavity extends through the package body from a first surface of the package body to a second surface of the package body;
wherein the active microelectronic device and the passive microelectronic device are electrically connected by conductive routes formed in or on the package body, wherein the active microelectronic device is embedded in the package body and wherein an active surface of the active microelectronic device is substantially planar to a second surface of the package body, wherein the conductive routes are formed in a redistribution layer formed on the active microelectronic device active surface and the package body second surface.

23. A method of fabricating a microelectronic package comprising:
forming an active microelectronic device;
forming a package body;
contacting the package body with the active microelectronic device;
forming conductive routes in or on the package body wherein the forming the cavity in the package body comprises forming the cavity to extend through the package body from a first surface of the package body to a second surface of the package body;
forming a cavity in the package body;
disposing a passive microelectronic device within the cavity; and
electrically connecting the active microelectronic device and the passive microelectronic device with the conductive routes, wherein forming the package body and contacting the package body with the active microelectronic device comprises embedding the microelectronic device in the package body such that an active surface of the microelectronic device is substantially planar to a second surface of the package body, wherein forming conductive routes in or on the package body comprises forming in a redistribution layer formed on the microelectronic device active surface and the package body second surface.

24. A computing device, comprising:
a board; and
a microelectronic package attached to the board, wherein the microelectronic package comprises:
an active microelectronic device in contact with a package body; and
a passive microelectronic device disposed within a cavity formed in the package body, wherein the cavity extends through the package body from a first surface of the package body to a second surface of the package body;
wherein the active microelectronic device and the passive microelectronic device are electrically connected by conductive routes formed in or on the package body, wherein the active microelectronic device is embedded in the package body and wherein an active surface of the active microelectronic device is substantially planar to a second surface of the package body, wherein the conductive routes are formed in a redistribution layer formed on the active microelectronic device active surface and the package body second surface.

* * * * *